(12) United States Patent
Rollins

(10) Patent No.: US 7,358,819 B2
(45) Date of Patent: Apr. 15, 2008

(54) REDUCED-SIZE SENSOR CIRCUIT

(75) Inventor: George E. Rollins, Chelmsford, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 18 days.

(21) Appl. No.: 11/333,717

(22) Filed: Jan. 17, 2006

(65) Prior Publication Data

US 2007/0164825 A1   Jul. 19, 2007

(51) Int. Cl.
*H03F 3/08* (2006.01)
(52) U.S. Cl. .......................... 330/308; 330/69
(58) Field of Classification Search ............... 330/308, 330/69, 252, 260; 250/214 A
See application file for complete search history.

(56) References Cited

U.S. PATENT DOCUMENTS

| | | | |
|---|---|---|---|
| 3,989,959 A | 11/1976 | Renirie et al. | |
| 5,182,477 A | 1/1993 | Yamasaki et al. | |
| 5,808,296 A | 9/1998 | McMonagle et al. | |
| 6,292,052 B1 * | 9/2001 | Carlson | 330/9 |
| 6,762,596 B2 * | 7/2004 | Yokogawa et al. | 323/316 |
| 6,803,825 B2 * | 10/2004 | Chiou et al. | 330/308 |
| 6,822,515 B2 * | 11/2004 | Ichitsubo et al. | 330/285 |
| 7,184,799 B1 * | 2/2007 | Jin et al. | 455/574 |
| 7,199,652 B2 * | 4/2007 | Morimoto et al. | 327/560 |
| 2003/0218508 A1 | 11/2003 | Chiou et al. | |

* cited by examiner

*Primary Examiner*—Henry Choe
(74) *Attorney, Agent, or Firm*—John T. Pienkos; William R. Walbrun

(57) ABSTRACT

The present invention relates to circuits configured for implementation in sensors, sensors employing such circuits, and methods of operating and manufacturing such sensors and/or circuits. In at least some embodiments, the circuit includes a capacitor having a first input terminal and a first output terminal, a first amplifier having second and third input terminals and a second output terminal, and a second amplifier having fourth and fifth input terminals and a third output terminal. The first output terminal of the capacitor is coupled at least indirectly to the second input terminal, the fourth input terminal, and the third output terminal. Additionally, the second amplifier provides feedback current with respect to the capacitor depending upon signals provided to the fourth and fifth input terminals. The capacitor and each of the amplifiers can be implemented on an integrated circuit without any need for external components.

40 Claims, 5 Drawing Sheets

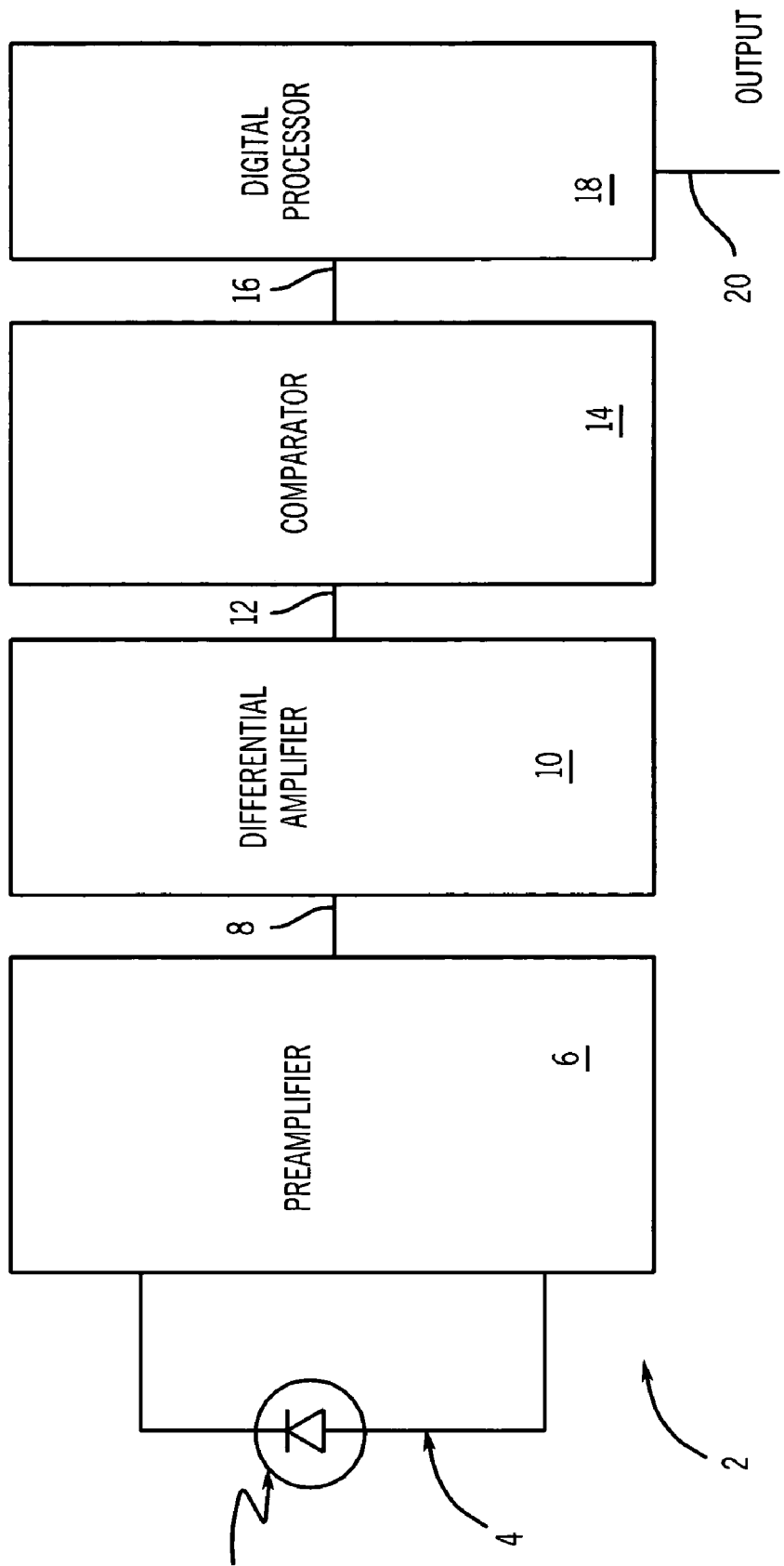

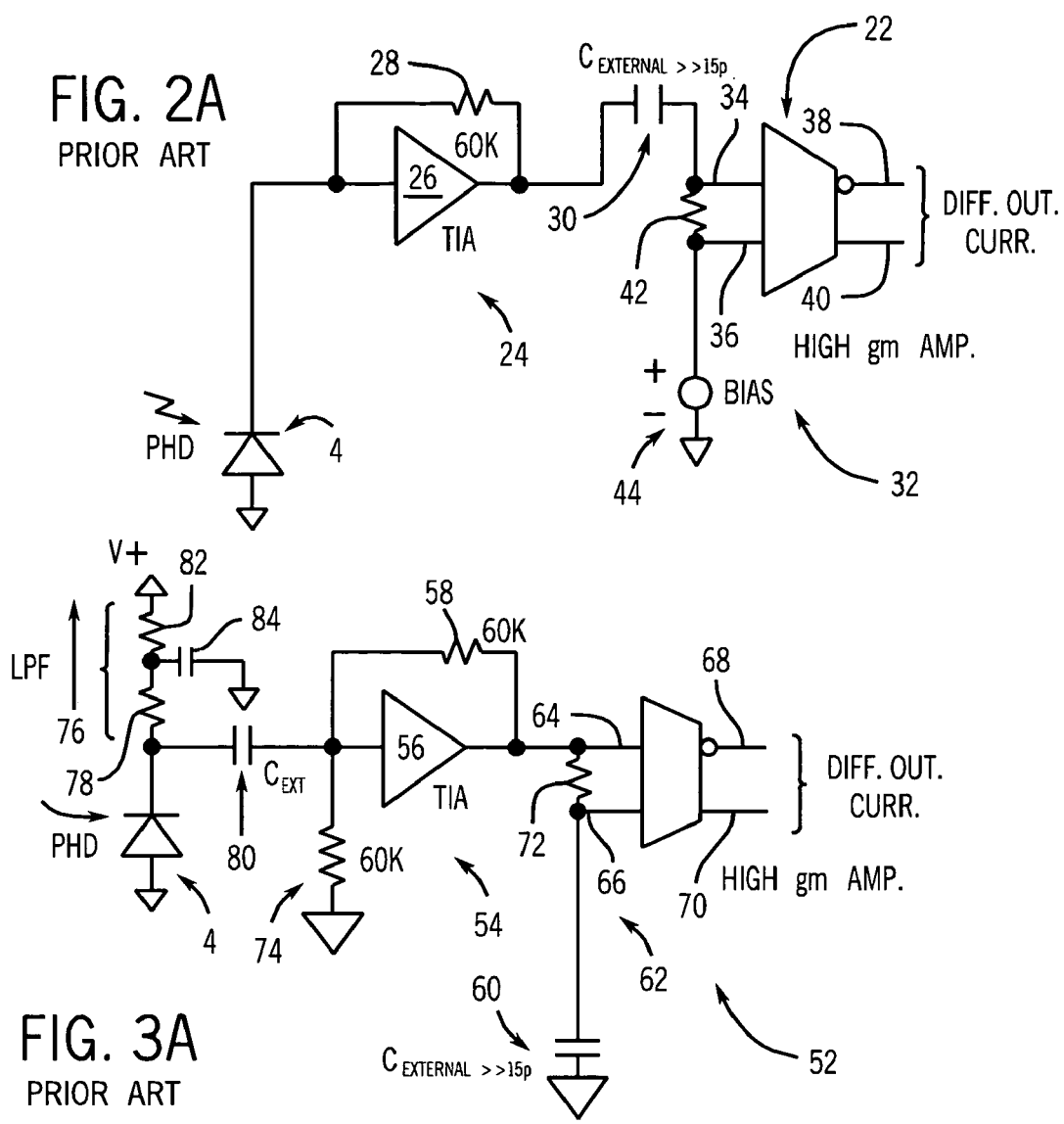
FIG. 2A PRIOR ART
FIG. 3A PRIOR ART
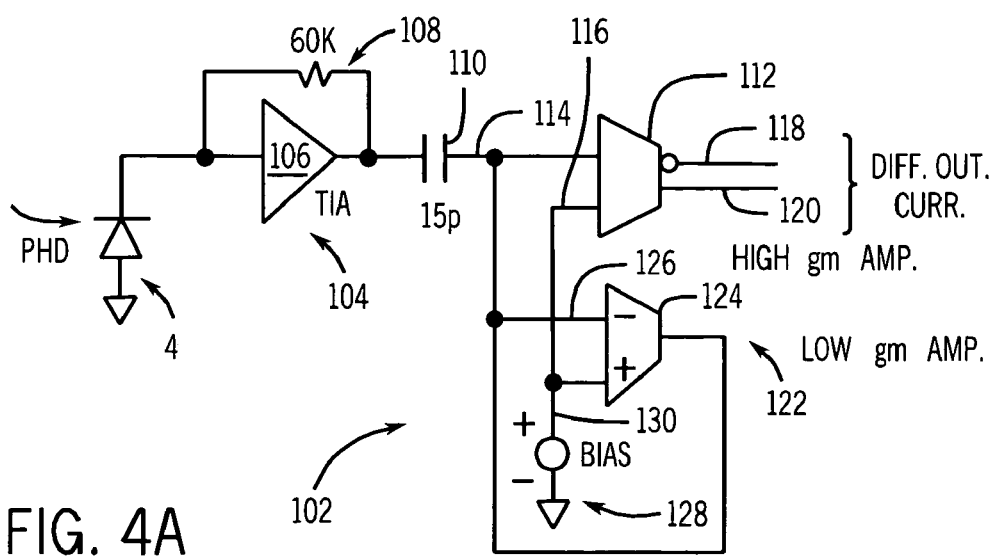
FIG. 4A

REDUCED-SIZE SENSOR CIRCUIT

CROSS-REFERENCE TO RELATED APPLICATIONS

- - -

STATEMENT REGARDING FEDERALLY SPONSORED RESEARCH OR DEVELOPMENT

- - -

FIELD OF THE INVENTION

The present invention relates to sensors and, more particularly, to sensors implemented at least in part by way of integrated circuits.

BACKGROUND OF THE INVENTION

Reduction of manufacturing costs and increased miniaturization continue to be important goals in the design of electrical components of a wide variety of types. Often these goals go hand-in-hand as increasing miniaturization helps to achieve reductions in the costs of assembling or implementing electrical circuitry.

The use of integrated circuits in electrical components often helps to achieve both of these goals. Yet the benefits achieved through the use of integrated circuits in terms of cost and size reduction often are restricted insofar as typically the integrated circuits must interface with other discrete electrical components in order to perform any desired function.

More particularly, in many applications electrical circuit devices are used that cannot be easily implemented on integrated circuits, for example, inductors, large capacitors or large resistors. When implemented as discrete devices, these devices tend to be relatively large such that they significantly increase the size of the overall electrical component (e.g., as constructed on a circuit board).

Further, in at least some cases the integrated circuits themselves need to be modified and even enlarged to include additional leads/pins to allow for coupling of the integrated circuits with the discrete devices. The addition of more leads/pins can increase not only the size but also the cost of the integrated circuit. Also, additional leads increase the susceptibility of the overall electrical component to noise.

The above considerations relating to the design of electrical components are particularly relevant in the case of designing sensors, for example, photosensors. Not only is it desirable to reduce the costs of sensors, but also, given that sensors are often implemented in confined spaces, and in sensitive environments, it is often particularly desirable to reduce the size of sensors as well as to reduce their susceptibility to noise.

Yet conventional sensors, and in particular conventional photosensors, typically include one or more large discrete devices such as large capacitors and large resistors that cannot be implemented on an integrated circuit. Further, to accommodate the use of these discrete devices in conjunction with integrated circuits that are often used in such sensors, the integrated circuits typically require large numbers of leads/pins.

For at least these reasons, therefore, it would be advantageous if an improved sensor design could be developed in which fewer discrete devices were used and/or the number of leads/pins of an integrated circuit included within the sensor could be reduced in comparison with conventional sensor designs. Indeed, in at least some embodiments, it would be advantageous if such an improved sensor design could be implemented without the use of any discrete devices except possibly a sensing device such as, in the case of a photosensor, a photodiode.

BRIEF SUMMARY OF THE INVENTION

The present inventor has recognized the desirability of achieving a sensor with a reduced size and/or cost, and further recognized that, in order to achieve such goals, it would be advantageous to design a sensor with fewer discrete devices and/or an integrated circuit having fewer leads/pins than are employed in conventional sensor designs. The present inventor has further recognized that many conventional sensors that utilize integrated circuits also include discrete devices that assist in preprocessing signals from a sensing device (e.g., current output by a photodiode) so that time-varying (e.g., AC) signals are provided to additional sensor processing circuitry while non-time-varying (e.g., DC) signals are filtered/rejected, and that to accommodate these discrete devices the integrated circuits often must have additional leads/pins. The present inventor has additionally recognized that such conventional sensors could be reduced in their size and/or cost, in at least some embodiments, by employing an integrated capacitor and a bias-stabilizing circuit, such that the number of discrete devices that are used could be reduced and such that the number of leads/pins of the integrated circuits could also be reduced.

More particularly, in at least some embodiments, the present invention relates to a circuit configured for implementation in a sensor. The circuit includes a capacitor having a first input terminal and a first output terminal, a first amplifier having second and third input terminals and a second output terminal, and a second amplifier having fourth and fifth input terminals and a third output terminal. The first output terminal of the capacitor is coupled at least indirectly to the second input terminal, the fourth input terminal, and the third output terminal. Additionally, the second amplifier provides feedback current with respect to the capacitor depending upon signals provided to the fourth and fifth input terminals.

Additionally, in at least some embodiments, the present invention relates to an integrated circuit. The integrated circuit includes means for filtering an input signal to produce an intermediate signal, means for amplifying the intermediate signal to produce an output signal, and means for generating a biasing feedback signal, the biasing feedback signal being communicated to the means for filtering.

Further, in at least some embodiments, the present invention relates to a method of operating a sensor. The method includes (a) providing an input signal from a sensory device, (b) amplifying at least one of the input signal and an intermediate signal derived from the input signal to produce an output signal; and (c) generating a bias feedback signal to influence the amplifying. At least (b) and (c) are performed by an integrated circuit.

Additionally, in at least some embodiments, the present invention relates to a method of manufacturing a sensor circuit. The method includes providing an integrated circuit having an integrated processing circuit, and coupling a plurality of external leads of the integrated circuit to a circuit board. The plurality of external leads is restricted to no more than a power lead, a ground lead, a gain lead, at least one sensory device lead, and at least one output signal lead.

BRIEF DESCRIPTION OF THE DRAWINGS

FIG. 1 is a block diagram showing exemplary components of an exemplary sensor, which in the present embodiment is a photosensor;

FIG. 2A is a simplified circuit schematic for an exemplary conventional (Prior Art) preprocessing portion (in combination with a photodiode) that can be employed in a photosensor such as that shown in FIG. 1, and that employs multiple discrete devices;

FIG. 3A is a simplified circuit schematic for another exemplary conventional (Prior Art) preprocessing portion (in combination with a photodiode) that can be employed in a photosensor such as that shown in FIG. 1, and that employs multiple discrete devices;

FIG. 4A is a simplified circuit schematic for an exemplary improved preprocessing portion (in combination with a photodiode) that can be employed in a photosensor such as that shown in FIG. 1, in accordance with at least some embodiments of the present invention.

DETAILED DESCRIPTION OF THE PREFERRED EMBODIMENT

Figure 2B:
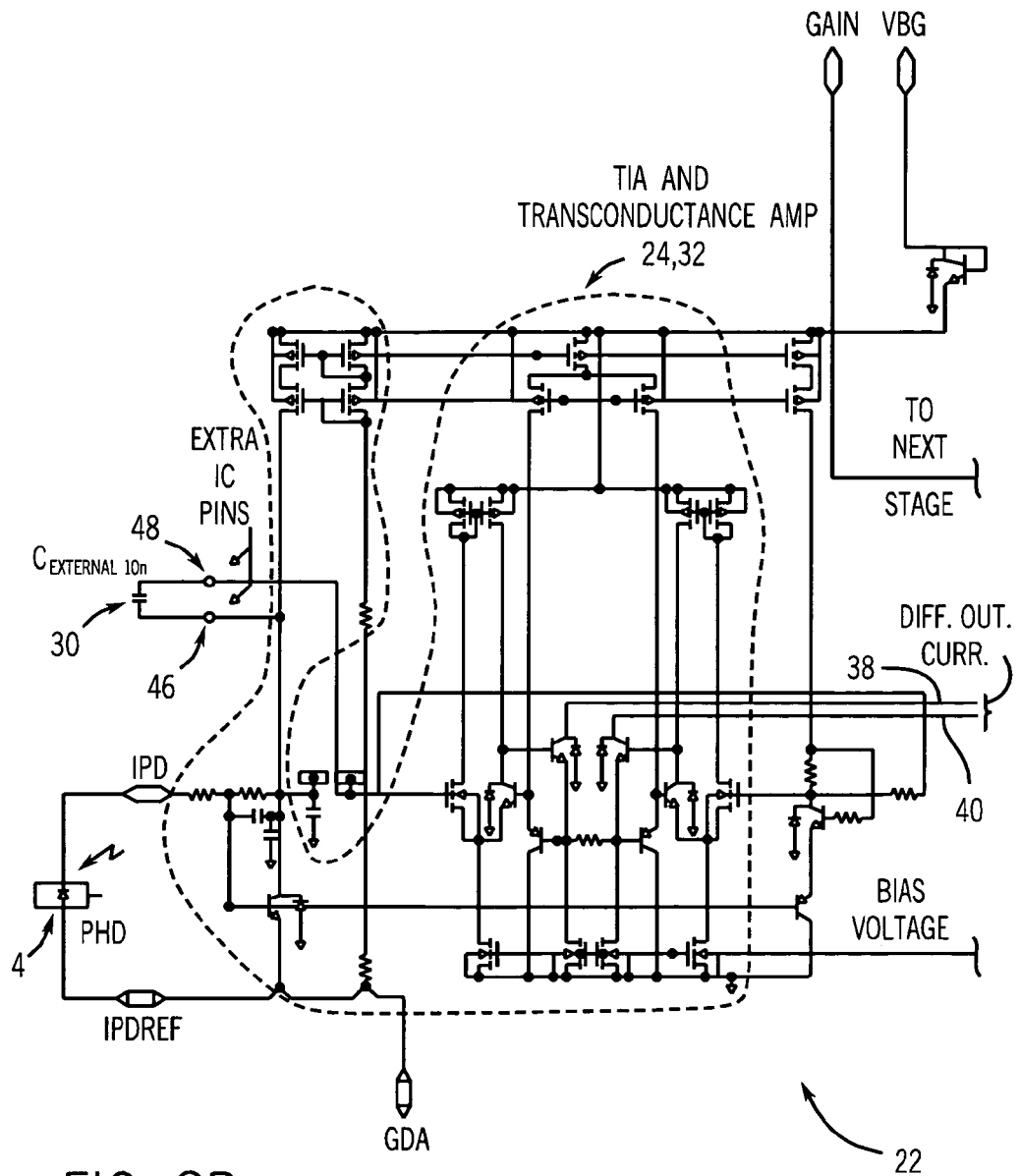
FIG. 2B is another circuit schematic showing in more detail the preprocessing portion of FIG. 2A (in combination with a photodiode)

Referring to FIG. 1, a simplified block diagram of an exemplary sensor, in this case shown to be a photosensor 2, is shown. The photosensor 2 includes a sensing device 4 that in this case is a photodiode coupled to an improved preamplifier or front end amplification section 6, which in turn outputs a signal 8 (or possibly more than one signal) to a differential amplifier 10. In the present embodiment, the differential amplifier 10 outputs an additional signal (or signals) 12 to a comparator 14, which in turn outputs a further signal (or signals) 16 to a digital processor 18. The digital processor 18 then is capable of providing an output signal 20 (or potentially more than one output signal) to another device or other devices, for example, an output device such as an LCD display, a computer, the internet or some other device or system that can utilize the information output by the digital processor 18.

The preamplifier 6 serves to take a signal or signals from the photodiode 4 and to amplify or at least pass a time-varying (e.g., AC) portion of those signals while filtering or rejecting a non-time-varying (e.g., DC) portion of those signals, such that the output signals 8 include only a time-varying component. The exact passband depends on the embodiment. As for the differential amplifier 10 it serves to amplify a difference between the signal 8 and another signal level, or potentially a difference between two signals provided as the signal 8. The comparator 14 typically in turn compares the output signal 12 from the differential amplifier with a particular comparison value or other standard, or even potentially compare two signals received from the differential amplifier 10 as the signal 12, and provide the signal 16 based upon that comparison. Finally, the digital processor 18 can perform a wide variety of operations based upon the signal or signals 16 received from the comparator 14 as well as other information received from other sources. The digital processor 18 in certain embodiments can be a microprocessor or other device capable of high levels of processing of the information received from the comparator, for the purpose of analysis or other purposes such as generating signals appropriate for driving output devices such as a display.

As discussed in further detail below with respect to FIGS. 2A-3B, many conventional photosensors employ preamplifiers corresponding to the preamplifier 6 that include one or more discrete devices such as large capacitors or resistors. Consequently, while the differential amplifiers, comparators and digital processors of photosensors employing such preamplifiers can largely or entirely be implemented on integrated circuits, the preamplifiers cannot be so integrated. In contrast, in accordance with at least some embodiments of the present invention, the improved preamplifier 6 can take the form shown in FIGS. 4A and 4B in which all of the components of the preamplifier can be implemented on an integrated circuit, and even on the same integrated circuit on which are implemented the differential amplifier 10, the comparator 14 and the digital processor 18. As a result, photosensors employing the preamplifier 6 shown in FIGS. 4A and 4B can be physically smaller and less costly to manufacture than conventional photosensors employing preamplifiers such as those in FIGS. 2A-3B. Also, the integrated circuit (or circuits) that are used to implement photosensors employing the preamplifier 6 shown in FIGS. 4A and 4B need not have as many leads/pins as integrated circuits implemented in conjunction with conventional preamplifiers such as those of FIGS. 2A-3B.

Although the present invention is intended to encompass photosensors such as the photosensor 2 shown in FIG. 1, it is also intended that the present invention encompass sensors of types other than photosensors, for example, vibration sensors, sound sensors, infrared sensors, other types of radiation sensors, position (or orientation/rotation) sensors, velocity or acceleration sensors, gravity sensors and other sensors. Further, the present invention is intended to encompass improved sensors utilizing improved preamplifiers such as that shown in FIGS. 4A-4B even when such sensors do not have each of a differential amplifier, comparator and digital processor (for example, in some cases, the sensors might only employ a differential amplifier and comparator in addition to the preamplifier, and the signals 16 from the comparator could be considered to be the output signals of the sensors). Additionally, the present invention is intended to encompass not merely sensors having "preamplifier" circuits but rather is intended to encompass any preprocessing or processing circuitry, whether implemented in sensors or other applications, that serves to filter or otherwise process signals, and that can be fully implemented on an integrated circuit through the use of an integrated capacitor and bias-stabilizing current generating circuitry similar to that described below in relation to FIGS. 4A-4B.

Turning to FIG. 2A, a conventional (Prior Art) embodiment of a preamplifier 22 that could be implemented in place of the preamplifier 6 of FIG. 1, in combination with the photodiode 4, is shown in simplified schematic form. As shown, the preamplifier 22 includes a transimpedance amplifier (TIA) 24 including both an inverting amplifier 26 in parallel with a transimpedance feedback resistor 28 coupled between the input and output terminals of the operational amplifier 26. The TIA 24 is connected in series between the cathode of the photodiode 4 (the anode of which is connected to ground) and a capacitor 30. The capacitor 30 in turn is coupled in series between the TIA 24 and a high transconductance amplifier 32 having first and second input ports 34 and 36 and additionally first (inverting) and second (non-inverting) output ports 38 and 40, respectively. The two input ports 34 and 36 are coupled by way of a resistor 42. Additionally, while the first input port 34 is coupled to the capacitor 30, the second input port 36 is coupled to ground by way of a DC bias voltage source 44. The high transconductance amplifier 32 outputs across the output ports 38 and 40 a differential output current, which serves as the signal 8 shown in FIG. 1 and is provided to a differential amplifier such as the differential amplifier 10.

Referring additionally to FIG. 2B, the conventional preamplifier 22 of FIG. 2A is shown in more detail along with the photodiode 4. In particular, FIG. 2B shows various circuit components that can be used to form the TIA 24 and the high transconductance amplifier 32 of FIG. 2A and which further can be implemented on an integrated circuit. Also evident from FIG. 2B are the output ports 38, 40 of the high transconductance amplifier 32, as well as the capacitor 30.

As indicated by FIG. 2A, the capacitor 30 in this embodiment necessarily is an discrete device external of the integrated circuit, due to its large size (in this case, 10 nanofarads). Because the external capacitor 30 is so large, and cannot be implemented on an integrated circuit, the integrated circuit on which the TIA 24 and the transconductance amplifier 32 are implemented must include first and second additional leads/pins 46 and 48, respectively, to which are coupled the leads of the capacitor 30. Thus, while the preamplifier 22 shown in FIG. 2B is capable of satisfactorily operating as a preamplifier in a photosensor, the circuitry for the preamplifier cannot be reduced in size beyond a minimal amount of volume required to hold both the integrated circuit and the capacitor 30, and requires the special pins 46, 48 in order to mount the capacitor. For this reason, the preamplifier 22 is size-restricted, and manufacture of the preamplifier necessarily involves incurring costs relating to the implementation of the capacitor 30.

Turning to FIG. 3A, another conventional (Prior Art) embodiment of a preamplifier 52 that could be implemented in place of the preamplifier 6 of FIG. 1 is shown in a simplified schematic form, in combination with the photodiode 4. As with the preamplifier 22, the preamplifier 52 includes a TIA 54 formed from the parallel combination of an inverting amplifier 56 and a transimpedance feedback resistor 58. Also, the preamplifier 52 includes a high transconductance amplifier 62 having first and second input ports 64 and 66, respectively, which are coupled by way of a resistor 72, and also first (inverting) and second (non-inverting) output ports 68 and 70, respectively. In contrast to the preamplifier 22, however, the TIA 54 (in particular, the output node of the inverting amplifier 56 that is coupled to the transimpedance resistor 58) is the same node as the first input port 64 of the high transconductance amplifier 62, without any capacitor therebetween. Also, rather than coupling the second input port 66 of the transconductance amplifier 62 to a DC bias voltage source, the second port 66 instead is coupled to ground by way of a first capacitor 60. Additionally, the input port of the TIA 54, to which the transimpedance feedback resistor 58 is coupled, is coupled both to ground by way of an additional resistor 74 and to the cathode of the photodiode 4 by way of a second capacitor 80, thus setting the appropriate bias voltage for the transconductance amplifier 62. The cathode of the photodiode 4 is also coupled to a positive DC voltage source 76 by way of a series combination of first and second additional resistors 78 and 82, respectively. A node between the resistors 78, 82 is also coupled to ground by way of an additional capacitor 84.

Figure 3B:
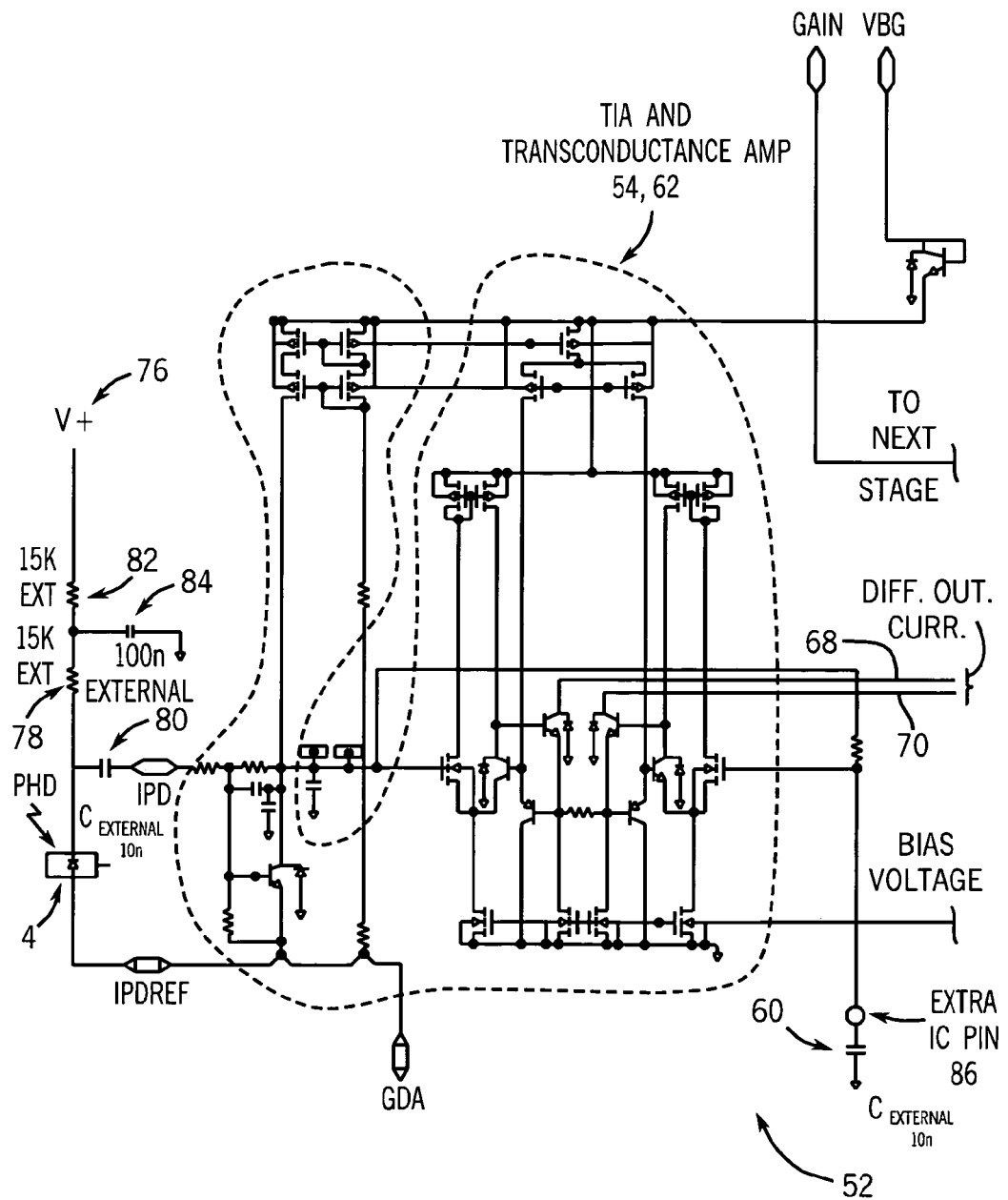
FIG. 3B is another circuit schematic showing in more detail the preprocessing portion of FIG. 3A (in combination with a photodiode)

Referring additionally to FIG. 3B, a more detailed schematic is provided of the preamplifier 52 along with the photodiode 4. As in the case of the preamplifier 22 shown in FIG. 2B, components of the TIA 54 and the high transconductance amplifier 62 that generates the output currents on the output ports 68, 70 can all be implemented on an integrated circuit (along with certain other components also shown in the FIG.). However, in contrast to the embodiment of FIG. 2B, the preamplifier 52 has not merely one external discrete device (e.g., the external capacitor 30 of FIG. 2B) but rather has 5 external discrete devices including the capacitors 60, 80 and 84, as well as the resistors 78 and 82. While having a larger number of external devices than the preamplifier 22, the preamplifier 52 requires only one additional pin/lead 86 allowing the capacitor 60 to be coupled to the high transconductance amplifier 62. In any event, as in the case of the preamplifier 22, the preamplifier 52 requires a number of external discrete devices that cannot be mounted on the integrated circuit and also requires at least one extra lead/pin be provided on the integrated circuit to accommodate these external devices.

Although FIGS. 2A-3B show two conventional embodiments of preamplifiers, other conventional (Prior Art) configurations are also known. For example, another conventional design utilizes the output difference of dual photodiode and transimpedance amplifiers with different band pass regions, thus rejecting low frequency photo current. However, such other conventional designs have other limitations; for example, dual photodiode/transimpedance amplifier configurations require dual photodiodes, of which only one of the two photodiode/transimpedance amplifier circuits is sensitive to the desired time-varying signal. Further, such circuits require additional amplifiers (e.g., a second transimpedance amplifier) that increase costly integrated circuit die area, and are limited in their degree of rejection.

Figure 4B:
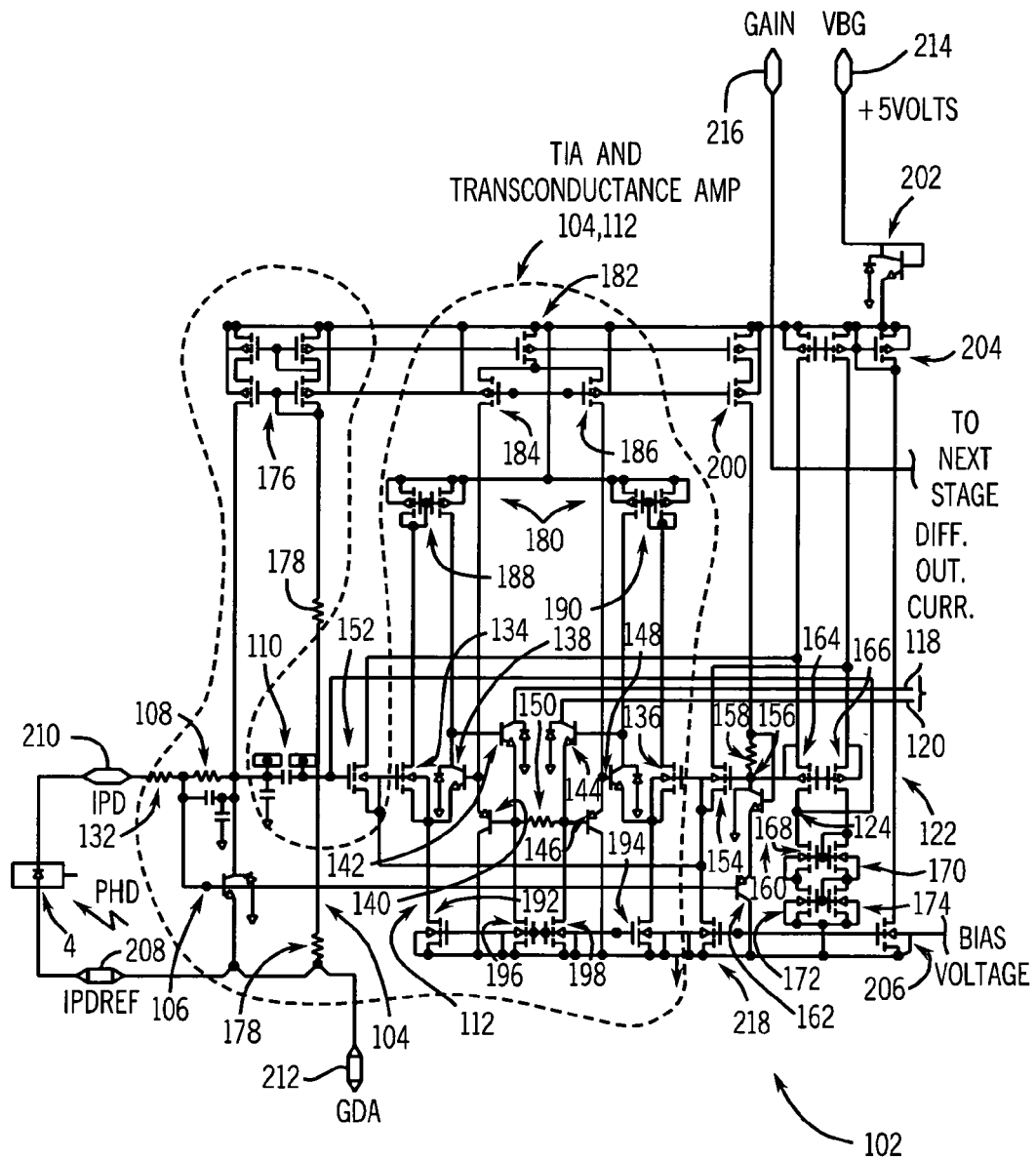
FIG. 4B is another circuit schematic showing in more detail the preprocessing portion of FIG. 4A (in combination with a photodiode).

Turning to FIGS. 4A and 4B, simplified and more detailed schematic representations are provided of an improved preamplifier 102 that can be used as the preamplifier 6 in conjunction with the photodiode 4 in accordance with at least some embodiments of the present invention. As shown, the preamplifier 102 includes a TIA 104 that includes an inverting amplifier 106 having input and output terminals that are coupled together by way of a transimpedance feedback resistor 108, with the input terminal also being coupled to the cathode of the photodiode 4. Additionally, the preamplifier 102 includes a high transconductance amplifier 112 having first and second input ports 114 and 116, respectively, and first (inverting) and second (non-inverting) output ports 118 and 120, respectively. As in the case of the preamplifier 22, the output port of the TIA 104 is coupled to the first input port 114 of the high transconductance amplifier 120 by way of a capacitor 110. However, the capacitor 110 is much smaller than the capacitor 30 of the preamplifier 22 and, in the present embodiment, is 15 picofarads. Also, instead of the input ports 114 and 116 of the high transconductance amplifier 112 being coupled by way of any resistor, instead the input ports are respectively coupled to different respective ports of a low transconductance amplifier 122. More specifically, the low transconductance amplifier 122 has an output port 124 that is coupled both to the first input port 114 of the high transconductance amplifier 112 and also to an inverting input 126 of the low transconductance amplifier 122. Further, a DC biasing voltage source 128 is coupled between ground and each of the second input port 116 of the high transconductance amplifier 112 and also a non-inverting input 130 of the low transconductance amplifier 122.

The preamplifier 102 operates as follows. The TIA 104 converts a current signal from the photodiode 4 into a voltage signal at the output of the TIA for receipt by the capacitor 110, with the voltage being related to the current by a factor of the resistance of the resistor 108 (e.g., by 60K). The capacitor 110 not only receives this voltage signal but also sees a low impedance circuit looking back towards the TIA 104 and the photodiode 4, such that the impedance looking back from the first input port 114 of the high transconductance amplifier 112 looking back towards the capacitor 110 appears to be merely the impedance/capacitance provided by that capacitor (e.g., 15 picofarads). The capacitor 110, while serving to link the TIA 104 with the transconductance amplifiers 112 and 122, also defines a frequency response with a low frequency cutoff such that low frequency signals and DC signals are not transmitted from the TIA to the transconductance amplifiers. Thus, high frequency (e.g., high frequency AC) signals that are of interest from the photodiode are transmitted to the transconductance amplifiers 112, 122, while any DC or low frequency (ambient) signals are filtered out/rejected.

In addition, the low transconductance amplifier 122 serves to provide bias-stabilizing negative feedback current to the first input port 114 of the high transconductance amplifier 112. The bias-stabilizing feedback current, which is a weak, AC ("push-pull") current, bias stabilizes the high transconductance amplifier 112. More particularly, if the voltage at input port 114 falls below the voltage at input port 116 (which is the voltage provided by the DC biasing voltage source 128), the low transconductance amplifier 122 tends to provide a current that charges the capacitor 110 so as to lift the voltage at the input port 114, and if the voltage at the input port 114 tends to increase above the voltage at the input port 116, then the low transconductance amplifier tends to output a current in relation to the capacitor 110 tending to reduce the voltage at the port 114. Further, even though the low transconductance amplifier 122 tends to provide negative feedback such that the voltage at the input port 114 of the high transconductance amplifier 112 tracks the voltage of the port 116, the AC signal communicated from the photodiode 4 by way of the TIA 104 and the capacitor 110 nevertheless tends to be reflected in the time-varying output at the output ports 118 and 120. The desired signal is passed within the pass band defined by the low frequency pull created by the capacitance value of the capacitor 110 and the bias-stabilizing feedback current and the high frequency pull of the amplifier roll-off.

Referring additionally to FIG. 4B, the preamplifier 102 is shown in more detail along with the photodiode 4. As shown, in at least some embodiments, the TIA 104 is formed by the combination of the resistor 108 coupled between base and collector terminals of a bipolar junction transistor (BJT) that forms the inverting amplifier 106, with the emitter of the BJT being coupled to ground. Although not shown with respect to FIG. 4A, an additional small resistor 132 (which is optional, and which in the present embodiment prevents high-frequency peaking of the transimpedance amplifier output voltage due to the photodiode's capacitance) can also be coupled between the input port of the TIA 104 (and the resistor 108) and the photodiode 4. Although FIG. 4B also shows additional capacitances associated with the TIA 104 (e.g., a capacitance in parallel with the resistor 108 and capacitances between the output port of the TIA and ground), these are merely contended to represent stray capacitances and are not actual circuit elements. Further as shown in FIG. 4B, the high transconductance amplifier 112 in at least some embodiments includes first and second MOSFETs (metal oxide semiconductor field effect transistors) 134 and 136, which are N-type MOSFETs. The gate of the MOSFET 134 constitutes the first input port 114 of the high transconductance amplifier 112, and is coupled to the capacitor 110, which in turn is coupled to the resistor 108 and the BJT forming the inverting amplifier 106 of the TIA 104. The gate of the MOSFET 136 is the second input port 116 of the high transconductance amplifier 112 and is, as discussed in further detail below, coupled to several components of the low transconductance amplifier 122.

Further as shown, the high transconductance amplifier 112 further includes, in addition to the MOSFETs 134 and 136, six additional BJTs 138, 140, 142, 144, 146 and 148, with the transistors 138, 142, 144 and 148 being NPN BJTs and the transistors 140 and 146 being PNP BJTs. Additionally as shown, the gate and drain of the MOSFET 134 is coupled to the emitter of the BJT 138, the collector of which is coupled to the base of the BJT 142. Further, the base of the BJT 138 is coupled to the emitter of the BJT 140, the base of which is coupled to the emitter of the BJT 142. Similarly, the drain and gate of the MOSFET 136 are coupled to the emitter of the BJT 148, the base of which is coupled to the emitter of the BJT 146 and the collector of which is coupled to the base of the BJT 144. The base of the BJT 146 further is coupled to the emitter of the BJT 144. The combination of each of the MOSFETs 134 and 136 with its respective set of BJTs 138-142 and 144-148, respectively, operates as a unity gain buffer. The bases of the BJTs 140 and 146 are coupled together by way of a resistor 150 that conducts a differential current if there is a voltage differential between the voltages on the respective bases of the BJTs 140, 146. If such a differential current occurs through the resistor 150, then differential currents appear at the respective collectors of the BJTs 142 and 144, which respectively constitute the first and second output ports 118 and 120 of the high transconductance amplifier 112.

In addition to being coupled to the MOSFET 134 of the high transconductance amplifier 112, the capacitor 110 is also coupled to the gate of an additional MOSFET 152 that constitutes the input port 126 of the low transconductance amplifier 122 and that, together with a MOSFET 154, form a differential pair of MOSFETs of the low transconductance amplifier 122. As shown, while the sources of the MOSFETs 152 and 154 are coupled together, and the gate of the MOSFET 152 is coupled to the capacitor 110, the gate of the MOSFET 154 is coupled to a node 156 between a resistor 158 and a series combination of a NPN BJT 160 and a PNP BJT 162. Current flowing through the resistor 158 and the BJTs 160, 162 sets a voltage level at the node 156 that constitutes the bias voltage 128 shown in FIG. 4A. Consequently, the gate of the MOSFET 154 is set to the bias voltage and constitutes the input port 130 shown in FIG. 4A. Additionally, since the gate of the MOSFET 154 is coupled to the gate of the MOSFET 136 of the high transconductance amplifier 112, the bias voltage also is applied to the input port 116 of that amplifier as discussed with reference to FIG. 4A.

Additionally as shown, drains of the MOSFETs 152 and 154 are respectively coupled to respective sources of respective additional MOSFETs 164 and 166, which are P-type MOSFETS and together constitute a folded cascode of MOSFETs, the gates of MOSFETs 164 and 166 being coupled to the node 156. Because of the linking of the drains of the MOSFETs 152 and 154 with the sources of the MOSFETs 164 and 166, the currents within the drains of the MOSFETs 164 and 166 mirror those of the drains of the MOSFETs 152 and 154. A common drain of the MOSFET 164 and an additional series-connected MOSFET 168 is the output port 124 of the low transconductance amplifier 122 and is coupled both to the gate of the MOSFET 134 that is the first input port 114 of the high transconductance amplifier 112, as well as to the gate of the MOSFET 152 that is the inverting input port 126 of the low transconductance amplifier 122. The current communicated to or from the common drain of MOSFETs 164 and 168 is provided from or to the capacitor 110 that is coupled to each of the gates of the MOSFETs 134 and 152, and constitutes the negative bias-stabilizing feedback current of the low transconductance amplifier 122. Because of the cascode connection of MOSFETs 164 and 166, any difference in the signals provided from the MOSFETs 152 and 154 to the MOSFETs 164 and 166 results in a negative feedback being provided to or from the capacitor 110. It should further be noted that MOSFETs 168, 170, 172, and 174 constitute a current mirror, reflecting the drain current of MOSFET 166 to the drain current of MOSFET 168.

Although not described in detail above, as shown in FIG. 4B, the preamplifier 102 additionally includes further MOSFETs and other components used to power and/or bias the other components discussed above. These include a set of two pairs of series coupled, mirrored MOSFETs 176 used to bias the output port of the TIA 104, where one of the series-connected pair of MOSFETs is coupled to that output port and the other of the pair of series-connected MOSFETs is coupled to ground by way of a pair of resistors 178. Also, these include a set of five MOSFETs 180 including a first MOSFET 182 that is series coupled with a pair of mirrored MOSFETs 184 and 186 that are respectively coupled to the BJTs 138 and 140 and the BJTs 146 and 148, respectively. Additionally the set of MOSFETs 180 further includes two additional pairs of mirrored MOSFETs 188 and 190, where the MOSFETs 188 are respectively coupled to the MOSFET 134 and the collector of the BJT 138, and the MOSFETs 190 are respectively coupled to the MOSFET 136 and the collector of the BJT 148. Additionally as shown, the high transconductance amplifier 112 includes four further MOSFETs 192, 194, 196 and 198, with the MOSFETs 192 and 194 being respectively coupled to the MOSFETs 134 and 136, and the MOSFETs 196 and 198 being respectively coupled to the emitters of the BJTs 142 and 144, respectively, which are as discussed above also coupled to the respective opposite ends of the resistor 150. Further as shown, the low transconductance amplifier 122 also includes a series-connected pair of MOSFETs 200 that are coupled in series with the resistor 158 and BJTs 160 and 162, as well as a BJT 202 that is series-connected with a set of three mirrored MOSFETs 204, one of which is series-connected with an additional MOSFET 206 and the other two of which are respectively series coupled to the MOSFETs 164 and 166, respectively, as well as to the MOSFETs 152 and 154, respectively. Also as shown, each of the sources of the MOSFETs 152 and 154 is series-connected with a further MOSFET 218, which is coupled to ground. The gates of each of the MOSFETs 192, 194, 196, 198, 218 and 206 are all tied to a bias voltage (e.g., in the range of about 0.8 to 0.9 V) provided by a bias voltage source (not shown), such as a mirrored MOSFET.

The preamplifier 102 of FIGS. 4A and 4B is advantageous in comparison with each of the conventional preamplifiers described above with respect to FIGS. 2A-3B in several respects. Because the preamplifier 102 allows for the use of the capacitor 110, which is a small capacitor relative to the capacitor 30 of the preamplifier 22, the capacitor 110 can be implemented on the same integrated circuit on which all of the other components of the preamplifier are implemented, and potentially even all of the other components of the differential amplifier 10, the comparator 14 and the digital processor 18 of the photosensor 2 are implemented. That is, the capacitor 110 can be an integrated capacitor that is integrated with the other components of the preamplifier and potentially the other components of the photosensor 2 (including even possibly, in some embodiments, the photodiode 4 itself), and no discrete components other than the photodiode 4 are required. Additionally, the preamplifier 102 of FIGS. 4A and 4B can be implemented using an integrated circuit that has none of the extra leads/pins that were required in the embodiments of FIGS. 2A-3B to accommodate external components such as the capacitors 30, 60, 80 and 82, or the resistors 78 and 84. The integrated circuit can be implemented with only a minimum number of leads including two leads 208 and 210 by which the integrated circuit is coupled to the photodiode 4 (see FIG. 4B), a ground lead 212, a power lead 214, potentially a control lead which is a gain lead 216 (which is optional), and the two leads allowing for output of the differential output currents corresponding to the ports 118 and 120. More particularly, as shown, in the present embodiment, the gain lead 216 is for controlling gain associated with another stage of circuitry implemented on the integrated circuit (e.g., the differential amplifier), albeit in alternate embodiments the gain lead or other control lead(s) could be utilized to control operation of a pre-amplifier circuit such as the circuit 102 shown. Further, in many embodiments, the leads corresponding to the output ports 118 and 120 need not be leads/pins external to the integrated circuit, but rather can be internal leads connecting the components of the preamplifier 102 to the components of the differential amplifier 10 that also can be implemented on the very same integrated circuit.

Thus, the circuitry associated with the photosensor 2 can be reduced to as small of a size as is necessary to accommodate merely the integrated circuit and the minimum number of leads identified above, and indeed the photosensor can be implemented in an exceedingly simple manner involving merely the coupling of a photodiode to the leads 208 and 210 of the integrated circuit constituting the photosensor and then coupling the integrated circuit to power, ground and a control signal (or signals) as necessary and allowing for output signals as appropriate (e.g., by coupling the leads of the integrated circuit to leads on a circuit board). Indeed, because only a photodiode need be coupled to the integrated circuit rather than a photodiode in addition to various other external components such as capacitors and resistors, the preamplifier and the photosensor both can be manufactured with less difficulty and lower cost. Additionally, it is even possible in some other embodiments that the photodiode itself will be integrated as part of the integrated circuit, such that no external leads are required on the integrated circuit for coupling to the photodiode. In such embodiments, manufacture of a sensor circuit merely requires mounting of the integrated circuit onto a circuit board (or other support structure), by which the integrated circuit can be coupled to a power source, ground, any control input(s) (e.g., a gain signal), and one or more device to which the integrated circuit is to provide output signals.

A further benefit provided by at least some embodiment of the present invention is improvement in signal to noise ratio by the additional rejection of low frequency noise internally generated by preceding amplification. Many sensors such as photosensors require a high sensitivity to modulated light from a light source, while rejecting ambient and low frequency light from sources such as natural and artificial lighting. In at least some embodiments of the present invention, the sensor can allow for detection of intensity differences that are greater than three orders of magnitude.

Although various embodiments of the present invention are described above, the present invention is intended to encompass many other variations of the present invention, including many different variations of the circuitry described in relation to FIGS. 4A-4B. For example, in at least some alternate embodiments, a transimpedance amplifier such as the TIA 104 is not required. Further for example, an input device such as the photodiode 4, particularly an input device providing a low impedance/voltage output, could be coupled directly to the capacitor 110. Also, while the transconductance amplifiers 112, 122 described above have been respectively referred to as "high" and "low" transconductance amplifiers, the relative amplifications provided by the two amplifiers can vary greatly and, indeed, in at least some embodiments the two transconductance amplifiers could provide equal levels of amplification or even the "high" amplification amplifier could be replaced with a "low" amplification amplifier and vice-versa. Additionally, while the transconductance amplifier 112 in the embodiment of FIGS. 4A-4B provides two differential current outputs, in alternate embodiments only a single output need be provided and/or the output or outputs could be voltage-type outputs.

Thus, it is specifically intended that the present invention not be limited to the embodiments and illustrations contained herein, but include modified forms of those embodiments including portions of the embodiments and combinations of elements of different embodiments as come within the scope of the following claims.

I claim:

1. A circuit configured for implementation in a sensor, the circuit comprising:
    a capacitor having a first input terminal and a first output terminal;
    a first amplifier having second and third input terminals and a second output terminal; and
    a second amplifier having fourth and fifth input terminals and a third output terminal; and
    wherein the first output terminal of the capacitor is coupled at least indirectly to the second input terminal, the fourth input terminal, and the third output terminal, and
    wherein the second amplifier provides feedback current with respect to the capacitor depending upon signals provided to the fourth and fifth input terminals; and
    a third amplifier having a fourth output terminal coupled to the first input terminal of the capacitor, and a sixth input terminal couplable at least indirectly to a sensory device.

2. The circuit of claim 1, wherein the capacitor is of sufficiently small size as to be implemented on an integrated circuit along with each of the amplifiers.

3. The circuit of claim 2, wherein feedback current is a negative biasing feedback current.

4. The circuit of claim 2, wherein the first input terminal of the capacitor receives a voltage input signal from a circuit having a low-impedance output.

5. The circuit of claim 1, wherein each of the first and second amplifiers is a transconductance amplifier.

6. The circuit of claim 5, wherein the first amplifier is a high transconductance amplifier and the second amplifier is a low transconductance amplifier.

7. The circuit of claim 1, wherein each of the third and fifth input terminals is coupled to a biasing voltage source.

8. The circuit of claim 1, wherein the first amplifier is a transconductance amplifier providing a pair of different current output signals.

9. The circuit of claim 1, wherein the third amplifier is a transimpedance amplifier, and the sensory device is a photodiode.

10. The circuit of claim 1, wherein each of the amplifiers and the capacitor is implemented on at least one integrated circuit.

11. The circuit of claim 1, wherein each of the sensory device, the capacitor and the two amplifiers is implemented on a single integrated circuit.

12. The circuit of claim 1, wherein the capacitor serves as a high-pass filter.

13. The circuit of claim 1, wherein at least one of the first and second amplifiers is formed from a plurality of metal oxide semiconductor field effect transistors (MOSFETs).

14. The circuit of claim 13, wherein at least two of the second, third, fourth and fifth input terminals are formed as respective gates of first and second MOSFETs.

15. An integrated circuit on which is implemented the circuit of claim 1, wherein the integrated circuit has a plurality of external leads, wherein the plurality of external leads is restricted to no more than a power lead, a ground lead, a gain lead, at least one sensory device lead, and at least one output signal lead.

16. The circuit of claim 1, wherein the circuit is a preamplification circuit.

17. An integrated circuit on which is implemented the circuit of claim 1, and further comprising at least one of a differential amplifier, a comparator, and a digital processor.

18. The integrated circuit of claim 17, wherein the integrated circuit includes the sensory device coupled at least indirectly to the first input terminal of the capacitor, the differential amplifier coupled at least indirectly to the second output terminal of the first amplifier, the comparator coupled to the differential amplifier, and the digital processor coupled to the comparator.

19. The integrated circuit of claim 18, wherein the integrated circuit includes at least one lead by which at least one output signal is provided by the digital processor to an external device, the external device including at least one of a microprocessor, a computer, a network, and a wireless transmitter.

20. A photosensor comprising the circuit of claim 1 and further including a photodiode coupled to the circuit and providing a current indication thereto.

21. A sensor comprising the circuit of claim 1, wherein the sensor is at least one of a radiation sensor, a light sensor, a position sensor, a velocity sensor, an acceleration sensor, a gravity sensor, a vibration sensor, a sound sensor.

22. An integrated circuit comprising:
    means for filtering an input signal to produce an intermediate signal, wherein the means for filtering includes a transimpedance amplifier;
    means for amplifying the intermediate signal to produce an output signal; and
    means for generating a biasing feedback signal, the biasing feedback signal being communicated to the means for filtering.

23. The integrated circuit of claim 22, further comprising:
    means for further amplifying the output signal.

24. The integrated circuit of claim 22, further comprising a means for processing at least one of the output signal and a derivative signal based at least indirectly upon the output signal.

25. The integrated circuit of claim 24, wherein the means for processing includes at least one of a comparator and a digital processor.

26. The integrated circuit of claim 22, further comprising a sensing device that provides the input signal.

27. A sensor comprising the integrated circuit of claim 22.

28. The sensor of claim 27, wherein the sensor is a photosensor and further includes a photodiode.

29. A method of operating a sensor, the method comprising:
(a) providing an input signal from a sensory device;
(b) amplifying an intermediate signal, which is derived at least in part from the input signal by way of a transimpedance amplifier, to produce an output signal; and
(c) generating a bias feedback signal to influence the amplifying,
wherein at least (b) and (c) are performed by an integrated circuit.

30. The method of claim 29, further comprising filtering at least one of the input signal and a further signal derived from the input signal to generate the intermediate signal.

31. The method of claim 30, further comprising amplifying the input signal to generate the further signal, which is then filtered.

32. The method of claim 29, wherein the input signal is received at least indirectly from a sensory device that is also implemented on the integrated circuit.

33. The method of claim 29, wherein the sensor is a photo sensor, and the input signal is received at least indirectly from a photodiode.

34. A method of manufacturing a sensor circuit, the method comprising:
providing an integrated circuit having an integrated processing circuit; and
coupling a plurality of external leads of the integrated circuit to a circuit board, wherein the plurality of external leads is restricted to no more than a power lead, a ground lead, a gain lead, at least one sensory device lead, and at least one output signal lead;
wherein the integrated circuit includes a transimpedance amplifier, a first transconductance amplifier, a second transconductance amplifier, and a filter capacitor linking the transimpedance amplifier with an input terminal of the first transeonductance amplifier, wherein the filter capacitor is also coupled to an output terminal of the second transconductance amplifier to receive a bias feedback signal.

35. The method of claim 34, wherein the plurality of external leads that are coupled to the circuit board do not include any sensory device lead, and wherein the integrated circuit includes an integrated sensory device.

36. The method of claim 35, wherein the integrated sensory device is a photodiode.

37. The method of claim 34, wherein the preprocessing circuit includes a pre-amplification circuit and at least one of a differential amplifier, a comparator and a digital processor.

38. A circuit configured for implementation in a sensor, the circuit comprising:
a capacitor having a first input terminal and a first output terminal;
a first amplifier having second and third input terminals and a second output terminal; and
a second amplifier having fourth and fifth input terminals and a third output terminal;
wherein the first output terminal of the capacitor is coupled at least indirectly to the second input terminal, the fourth input terminal, and the third output terminal,
wherein the second amplifier provides feedback current with respect to the capacitor depending upon signals provided to the fourth and fifth input terminals,
wherein at least one of the first and second amplifiers is formed from a plurality of metal oxide semiconductor field effect transistors (MOSFETs), and
wherein at least two of the second, third, fourth and fifth input terminals are formed as respective gates of first and second MOSFETs.

39. An integrated circuit comprising:
a circuit configured for implementation in a sensor, the circuit including
a capacitor having a first input terminal and a first output terminal,
a first amplifier having second and third input terminals and a second output terminal, and
a second amplifier having fourth and fifth input terminals and a third output terminal,
wherein the first output terminal of the capacitor is coupled at least indirectly to the second input terminal, the fourth input terminal, and the third output terminal, and
wherein the second amplifier provides feedback current with respect to the capacitor depending upon signals provided to the fourth and fifth input terminals and further comprising at least one of a differential amplifier, a comparator, and a digital processor; and
at least one of a differential amplifier, a comparator, and a digital processor,
wherein the integrated circuit includes the sensory device coupled at least indirectly to the first input terminal of the capacitor, the differential amplifier coupled at least indirectly to the second output terminal of the first amplifier, the comparator coupled to the differential amplifier, and the digital processor coupled to the comparator.

40. The integrated circuit of claim 18, wherein the integrated circuit includes at least one lead by which at least one output signal is provided by the digital processor to an external device, the external device including at least one of a microprocessor, a computer, a network, and a wireless transmitter.

* * * * *

UNITED STATES PATENT AND TRADEMARK OFFICE
CERTIFICATE OF CORRECTION

| | |
|---|---|
| PATENT NO. | : 7,358,819 B2 |
| APPLICATION NO. | : 11/333717 |
| DATED | : April 15, 2008 |
| INVENTOR(S) | : George E. Rollins |

It is certified that error appears in the above-identified patent and that said Letters Patent is hereby corrected as shown below:

Column 13, line 48: Replace "transeoductance" with --transconductance--.

Signed and Sealed this

Twenty-sixth Day of August, 2008

JON W. DUDAS
*Director of the United States Patent and Trademark Office*